United States Patent [19]

Cook

[11] Patent Number: 4,895,735
[45] Date of Patent: Jan. 23, 1990

[54] RADIATION INDUCED PATTERN DEPOSITION

[75] Inventor: Eliot V. Cook, Garland, Tex.

[73] Assignee: Texas Instruments Incorporated, Dallas, Tex.

[21] Appl. No.: 162,722

[22] Filed: Mar. 1, 1988

[51] Int. Cl.$^4$ ............................................. B05D 3/06
[52] U.S. Cl. .................................. 427/43.1; 156/234; 427/53.1; 427/96; 427/97; 427/99
[58] Field of Search .............. 156/234; 427/43.1, 53.1, 427/96, 97, 99; 428/914

[56]  References Cited

U.S. PATENT DOCUMENTS

| | | | |
|---|---|---|---|
| T988,007 | 1/1979 | Preis et al. | 427/53.1 |
| 3,964,389 | 6/1976 | Peterson | 427/385.5 |
| 4,245,003 | 1/1981 | Oranahy et al. | 427/146 |
| 4,612,085 | 9/1986 | Jelks et al. | 156/643 |
| 4,752,455 | 6/1988 | Mayer | 427/53.1 |

OTHER PUBLICATIONS

Mayer et al., "Plasma Production by Laser Driven Explosively Heated Thin Metal Films," J. App. Phys. 57, 2/1985 pp. 827–829.

Roshon Jr., et al., IBM Tech. Disc. Bull., vol. 7, No. 3 Aug. 1964.

Higashi et al., "Spatial Resolution Limits On Projection Patterned Photodeposited Conducting Aluminum Films", *Extended Abstracts Beam-Induced Chemical Processes*, pp. 55–57, Proceedings of Symposium D 1985 Fall Meeting of the Materials Research Society.

Baum et al., "Projection Printing Of Gold Micropatterns By Photochemical Decomposition", *Appl. Phys. Lett. 49(18)*, 3 Nov. 1986, pp. 1213–1215.

Jain, Kanti, "Laser Application In Semiconductor Microlithography", *Microcircuit Engineering 83*, ed. by Ahmed et al., Academic Press 1983, pp. 182–190.

*Primary Examiner*—Stanley Silverman
*Attorney, Agent, or Firm*—Ferdinand M. Romano; Thomas W. DeMond; Melvin Sharp

[57]  ABSTRACT

A system and method for forming a pattern, such as a layer of metallization, on a surface. A layer comprising patterning material is positioned next to a deposition surface and a portion of the layer is heated to deposit some of the patterning material on the surface. The invention provides a means for transferring a pattern under atmospheric temperature and pressure conditions.

44 Claims, 3 Drawing Sheets

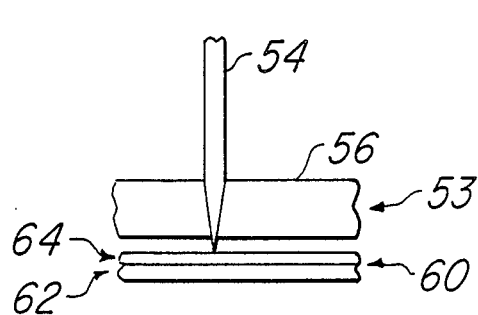
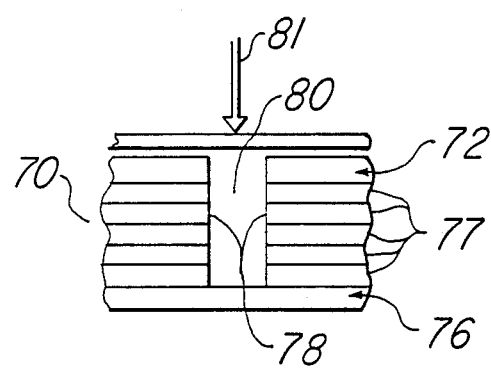
Fig. 5                    Fig. 6
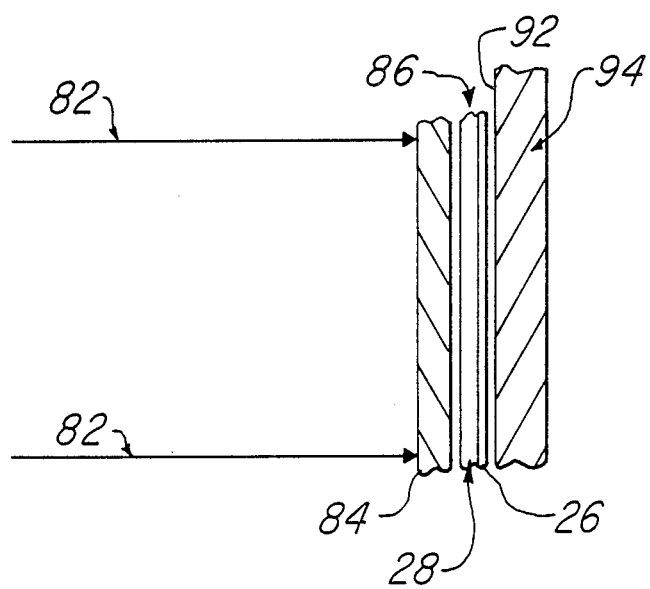
Fig. 7

RADIATION INDUCED PATTERN DEPOSITION

FIELD OF THE INVENTION

The present invention relates generally to a method and an apparatus for depositing a material onto a surface and in one form to a novel application of radiant energy for effecting the deposition of material from a solid layer onto a surface in order to form a pattern.

BACKGROUND

A wide variety of lithographic technique have been employed to produce predefined patterns on the surfaces of many materials including resins, semiconductors, metals and paper. For many applications these techniques require complex machinery and processes. Some reproduction techniques, such as the types employed in the electronics industry for circuit manufacture, are quite costly and time consuming, thus requiring large scale production in order to be cost effective. This has placed severe constraints on efforts to evaluate new circuit concepts and test prototype circuit designs.

Numerous methods for depositing metal patterns on circuit structures have required costly preparation of photomasks. More recently, laser processes have been explored in an effort to deposit conductive material on insulating surfaces. See, for example, U.S. Pat. No. 4,496,607 to Mathias, which discloses use of a laser beam to melt tracks onto substrates into which conductive particles are simultaneously impinged. Because the method disclosed in the Mathias patent requires melting a trace into the substrate in order to fuse conductive particles in a pattern, the technique has limited utility when the surface material is subject to temperature constraints.

Processes for photochemical deposition have also been demonstrated with focused laser beams to "directly write" thin film patterns. Generally, decomposition techniques, e.g., laser induced chemical vapor deposition of metal films, are performed under partial vacuum conditions and require use of reactive gases. Many of these are serial deposition techniques and are therefore inherently slow in comparison to production oriented photolithography.

A paper by Higashi and Fleming, "Spatial Resolution Limits On Projection Patterned Photodeposited Conducting Aluminum Films" [Proceedings of Symposium D 1985 Fall Meeting of the Materials Research Society] published in *Extended Abstracts Beam Induced Chemical Processes*, 1985, suggests a solution to the speed limitations which have restricted the utility of this technique. The paper discloses a projection pattern technique wherein laser light is imaged through a photomask and onto a substrate which is positioned in a transparent cell. A gas such as trimethylaluminum is passed through the cell and decomposed to grow a pattern of aluminum. However, reported resistivities for room temperature depositions are in the range of 100 ohm-centimeters and increases in deposition cell temperature, while improving the conductive quality of the patterned layer, are accompanied by decreases in deposition rate, e.g., down to 0.4 Angstrom per second.

Generally, techniques which require subjecting the deposition surface to a partial vacuum are unsuitable for many applications due to the size or fragile nature of the surface.

SUMMARY OF THE INVENTION

In accordance with one embodiment of the invention a system and a method for operating the system are provided for forming a pattern of material on a deposition surface. A layer comprising the patterning material is placed next to the deposition surface and a portion of the layer is heated to deposit a portion of the patterning material on the surface. In one form of the method, deposition is accomplished by melting the patterning material and allowing the material to solidify upon the deposition surface.

In another embodiment of the invention a photomask is used in conjunction with a layer containing patterning material to create a highly conductive circuit pattern thus departing from the time consuming process of serially depositing patterning material, which process has in the past been characteristic of numerous direct write laser systems.

It is an object of the invention to provide a means for depositing a patterning material in a single step.

It is another object of the present invention to provide a technique suitable for transferring material to a surface in a predetermined pattern without requiring vacuum deposition techniques or other forms of isolation from the ambient environment. Accordingly, the invention comprises a means for depositing a pattern of material on a surface under atmospheric temperature and pressure conditions.

A further object of the invention is to provide a means for selectively depositing a limited amount of material in order to form connections in previously defined patterns without requiring the multiple processing steps required by many prior techniques.

These and other objects of the invention will become apparent from the following detailed description of the invention.

BRIEF DESCRIPTION OF THE DRAWINGS

The invention may best be understood by reference to the following detailed description of illustrative embodiments when read in conjunction with the accompanying drawings, wherein:

FIG. 5 provides a sectional view of an arrangement for repairing a photomask pattern according to the method;

FIG. 6 is a sectional view illustrating application of the method to metallize a contact hole; and FIG. 7 illustrates an application of the method wherein a photomask is used to create a circuit pattern on a surface.

Similar reference numbers are used in various figures to refer to similar items.

DETAILED DESCRIPTION OF THE INVENTION

The subject invention, believed to have broad application in the field of pattern production, was developed in the course of a program designed to overcome limitations in the art of forming symbols on delicate electronic circuit structures. The concepts disclosed herein are applicable to formation of patterns generally on a wide variety of material surfaces outside the electronic arts. Accordingly, specific embodiments of the method presented herein are only exemplary of the more general invention and the scope of the invention is only limited by the claims which follow this description.

Figure 1:
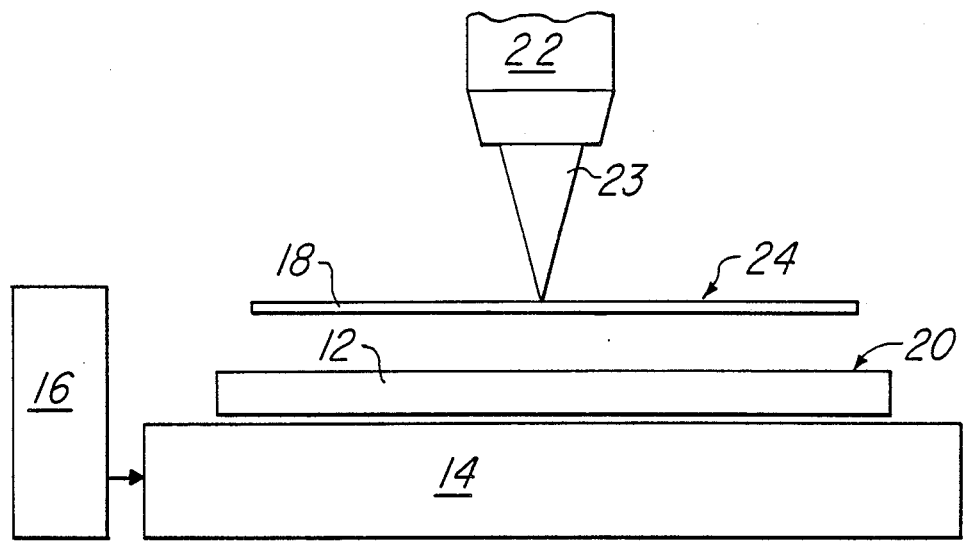
FIG. 1 illustrates apparatus for forming a pattern of material on a deposition surface according to the present invention.

With reference to FIG. 1 there is illustrated suitable apparatus for demonstrating numerous embodiments of the method. A substrate 12 of a type used for circuit fabrication is mounted upon a planar platform 14 which is translatable with two degrees of freedom in a plane which is parallel to the platform. A programmable drive mechanism 16 of a type well known in the art may be coupled to the platform for selective displacement. A foil 18 comprising patterning material is placed over the substrate and in close proximity to the surface 20 of the substrate upon which a predetermined pattern is to be formed. A laser based optical system 22 is positioned to direct a fixed beam 23 upon a portion of the surface 24 of the foil facing away from the surface 20. In order to minimize foil displacement with respect to the platform the foil may be secured in place. In many applications of the method the foil may simply be laid upon the surface 20.

The laser system 22 provides a narrow, high intensity beam 23 on the foil. The foil 18 effectively prevents direct radiation of the surface 20 with the laser beam. Yet the beam is of sufficient energy density to vaporize patterning material present in the foil. Vaporized material formed between the foil 18 and the substrate is allowed to condense upon the relatively cool surface 20. The drive mechanism 16 may be used to displace the platform as the material condenses in order to serially form a desired pattern along the surface 20 in direct correspondence to the selective displacement of the platform with respect to the laser beam. Preferably the foil moves with the platform so as to provide unspent foil in front of the laser beam while the pattern is formed.

One feature of the invention is the physical form of the patterning material used for the deposition. In the past, numerous direct write laser techniques have involved chemical vapor deposition and photolytic reactions. The method disclosed herein departs from these technologies because patterning material is directly transferred from a solid layer, e.g., a foil or plate, to a surface by inducing a physical change of state, but without requiring any chemical transformation. Such a writing technique is now made possible because the solid layer is structured to allow for deposition of patterning material by a heat transfer process through the solid layer. The solid layer retains necessary integrity for blocking direct radiation of the surface 20. If substantial radiation were to otherwise penetrate the solid layer, the ability to conformally map the desired pattern would deteriorate, e.g., the radiation could prevent condensation or solidification of material in desired locations. Furthermore, depending upon the energy density of the radiation, impingement of direct radiation upon the deposition surface could result in undesirable temperature increases thus limiting the usefulness of this method.

Accordingly, the foil should comprise a patterning material and a matrix material wherein the patterning material has a relatively low temperature of vaporization and the matrix material has a relatively high temperature of vaporization. Preferably, the melting temperature of the matrix material will be much higher than the vaporization temperature of the patterning material in order to provide a relatively thin foil having substantial structural integrity throughout the process.

The optimum structure and thickness of the solid layer, e.g., foil 18, may vary depending upon the specific application of the method. By way of example, the foil 18 may comprise a patterning material uniformly distributed with a matrix material that is opaque to the radiation. Patterning material which vaporizes from that surface of the foil which faces surface 20 would most readily condense to form the desired pattern. If the desired patterning material is a metal, an alloy containing the desired metal and a suitable matrix material may serve as the solid layer. Alternatively, the patterning material may comprise a semiconductor dopant, a dielectric or material having other desired properties. Of course the matrix element may comprise more than one material.

Figure 2:
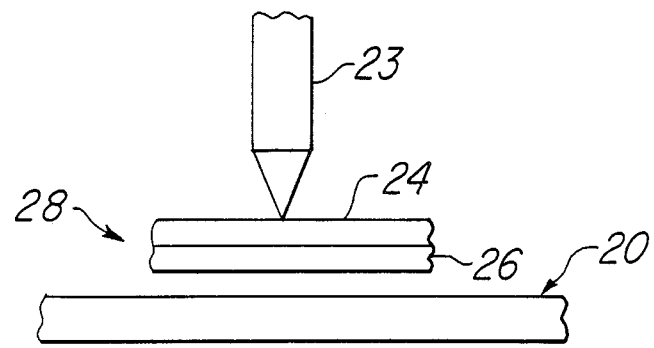
FIG. 2 illustrates a bilayer structure comprising patterning material.

Alternatively, the foil may be a bilayer or other laminated structure. In a simple form FIG. 2 illustrates a first layer 26 of patterning material positioned to face the surface 20 and a second adjoining layer 28 positioned to receive radiation from a laser beam 23 or other radiation source. The bilayer structure may be preferred when the patterning material is a precious metal or a material which cannot be conveniently distributed with the matrix material throughout the entire foil. This structure is also useful because it prevents vaporization of patterning material from the surface 24 of the foil. An intermediate binding material may be required to join the first layer 26 to the second layer 28.

It is not necessary for the foil 18 to physically contact the surface 20. However, the resolution of line patterns is a function of separation distance between the substrate 12 and the foil 18, as well as foil thickness and thermal conductivity characteristics of the matrix material and the patterning material. Line widths may be sized to a limited degree by varying the distance between the foil 18 and the surface 20.

Tests have been successfully conducted with a YAG laser having a 5 Watt output and a relatively broad beam width, e.g., 0.028 millimeters. A 0.051 millimeter thick foil of a nickel plated steel alloy was placed in contact proximity, e.g., within 0.025 millimeters, of the surface 20 with the nickel coating facing the surface of a glass substrate. Movement of the foil under the laser beam at a proximate rate of one millimeter per second resulted in the formation of a metal pattern on the glass surface. Patterns deposited in this manner exhibited a surprisingly uniform line width approximately 130 percent greater than the beam width.

The method as so far disclosed is useful for depositing a wide variety of materials, including conductive and dielectric materials, on numerous surfaces. Upon deposition the patterning material may form a chemical or an adhesive bond with the surface 20. Adherence of the patterning material is comparable to that of materials which have been deposited with conventional techniques. Metal deposition performed with this general method exhibits fairly uniform line width and thickness characteristics. The process has been utilized in conjunction with a programmable drive mechanism to symbolize surfaces.

Following this method the apparatus of FIG. 1 can also be used as a circuit fabrication system. By way of further example, a microwave circuit may be built with this apparatus by selecting patterning materials with appropriate resistive characteristics to form passive elements such as resistors and capacitors which are suitable for operation in the microwave regime. This approach offers the advantage of directly writing a circuit from software, e.g., a CAD mask, while bypassing all photomask preparation. Thus, with the present invention the time required for preparing or modifying a prototype circuit can be reduced from weeks or months to less than an hour.

Proximate melting and boiling points of numerous metals are presented in Table 1 below. Tungsten, having a relatively high melting point may be the most generally suitable material for the structural matrix of the foil. The patterning material may also be an alloy or other mixture. For example, a foil approximately comprising 20 percent tin and 80 percent gold has been used to deposit a metal pattern approximately comprising 80 percent tin and 20 percent gold. In this process the remaining foil constituents provide essential structural integrity to prevent substantial transmission of radiation through the foil. Generally, the resulting pattern composition is believed to at least be a function of foil composition, laser power density and the relative melting and boiling points of the foil constituents.

| METAL | MELTING POINT (CENTEGRADE) | BOILING POINT (CENTEGRADE) |
| --- | --- | --- |
| Ag | 960 | 1950 |
| Al | 660 | 2056 |
| Au | 1603 | 2600 |
| Cr | 1615 | 2200 |
| Cu | 1083 | 2300 |
| In | 155 | 1450 |
| Ni | 1452 | 2900 |
| Pb | 327 | 1620 |
| Pd | 1555 | 2200 |
| Pt | 1755 | 4300 |
| Sn | 232 | 2260 |
| Ta | 2850 | 4100 |
| Ti | 1800 | 3000 |
| W | 3370 | 5900 |
| Zn | 419 | 907 |

Complex integrated circuits are often designed such that a laser can be used to disconnect defective portions. As an alternative, the present method may also be applied to perform simple tasks such as the repair or modification of these and other circuits when limited patterning is required. Difficult spot repairs of surface wave and thin film microwave circuitry, as well as repair of metal clad rigid or flexible circuit boards, become simpler tasks with this method.

Figure 3:
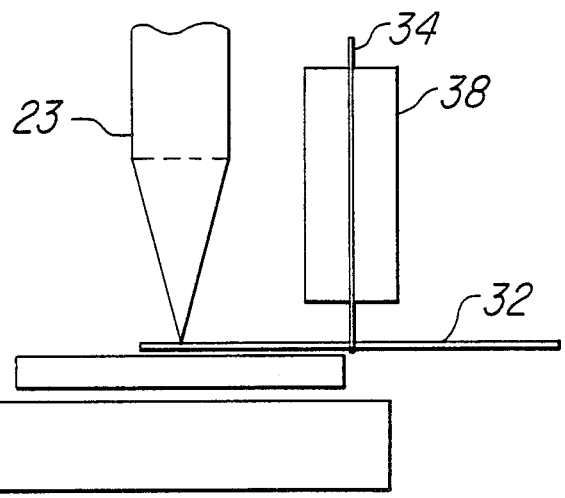
FIG. 3 illustrates an arrangement for patterning a surface wherein a foil or other solid layer comprising patterning material is rotatably mounted.

It is also noted that for these and other applications of the method the foil may be independently mounted. FIG. 3 illustrates a disk shaped layer 32 comprising patterning material. The layer 32 is mounted on a rotatable axis 34. Preferably, when the platform 14 moves in order to map the desired pattern the axis 34 moves with the platform 14 so that fresh foil is always available for deposition as the pattern is generated. Of course, in this and other embodiments of the invention the platform may be stationary while the radiation beam moves with respect to the deposition surface. With either approach, when substantial patterning material in one region of the foil is spent the foil can be rotated about the axis 34 to provide a fresh region for further laser deposition. A motor driven system 38 can be used to control rotation about the axis 34.

Figure 4:
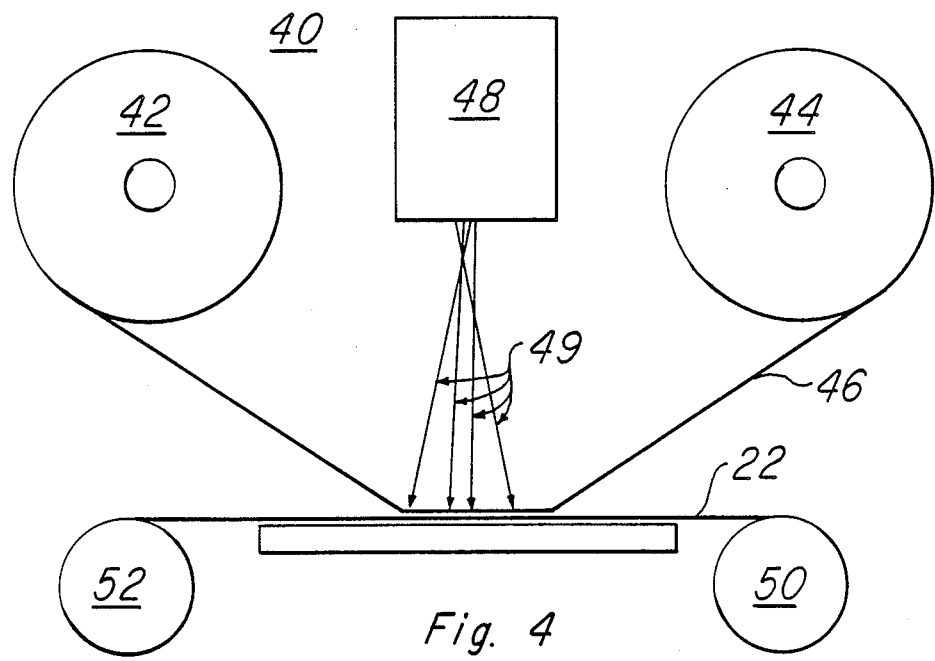
FIG. 4 schematically illustrates a work station arrangement for practicing the inventive method.

FIG. 4 schematically illustrates a dedicated work station 40 wherein a simple spool mechanism comprising a supply reel 42 and a take up reel 44 moves a roll of foil 46 over the deposition surface 22 in order to create a complex pattern or to repair a pattern. A laser system 48 provides multiple beams 49, each programmable for independent movement, in order to simultaneously deposit a plurality of lines upon the surface 22. Such a work station provides a complete system capable of rapidly generating complex and lengthy patterns quickly. This system design also assures effective utilization of the foil material.

The work station 40 is, for example, useful for fabricating conductive patterns on solar cells of the type which can be fabricated on a belt of material which would pass along the platform from a second supply reel 50 to a second take up reel 52. The laser beams 49 can pattern a high conductivity metal such as silver on the surface 22 of the belt. This application minimizes waste of precious material while providing low cost and high volume production of the solar cells. The method is particularly useful when a filament of uniform quality must be deposited over a relatively nonuniform surface such as one comprising 0.13 millimeter thick grains or the type of silicon granules used in the manufacture of some types of solar cells.

FIG. 5 illustrates application of the method for repair of photomasks. A glass mask 53 may be repaired by passing a beam 54 of radiation first through the nonemulsion side 56 of the mask 53 and onto a bilayered structure 60 comprising a layer of matrix material 62 and a layer of patterning material 64 positioned between the matrix material and the mask 53. Preferably the radiation is highly transmissive through the glass portion of the mask 53 as well as the patterning material 64. A suitable beam 54 may be formed with an ultraviolet laser. A feature of this method is that radiation is incident upon the surface of the matrix material 62 which interfaces the layer of patterning material. Greater resolution may be obtained with this configuration than by directly radiating the other surface of the matrix material 62 as was illustrated in FIG. 1. Absorption of radiant energy by the matrix material 62 causes the patterning material to vaporize and condense on the relatively cool mask 53 to repair or alter the existing mask pattern.

The method may also be used to form a variety of interlevel connections of the type found in multilayer circuits. By way of example, manufacturers have in the past had difficulty interconnecting widely separated layers of a circuit structure. FIG. 6 illustrates a multilevel structure 70 wherein an upper level 72 and a lower level 76 are separated by one or more intermediate levels 77. In such an arrangement the upper and lower levels 72 and 76 may need to be connected by metallization along the sidewalls 78 of a contact hole 80. With prior metallization techniques there has been some difficulty in providing sufficient quantities of conductive metal along the sidewalls of very deep holes.

The present invention may be applied to overcome this difficulty in forming deep contact holes. Accordingly, a laser beam 81 is positioned over the contact hole 80 and held stationary with respect to the structure 70. The foil is then moved under the laser beam 81, e.g., by means of the arrangement illustrated in FIG. 4, to deposit a thick layer of metal in order to fill the hole without depositing a significant amount of material substantially beyond the boundary of the hole. With proper selection of parameters this selective deposition can effectively fill holes of various sizes without shorting out other portions of the circuit.

The invention also provides a technique which, unlike photopatterning, does not require that the deposition surface be planar. The method can be applied to rough and curved surfaces as well as surfaces having sharp angles. Thus, for example, it can be used to form circuits and interconnect lines on curved circuit boards and on frames or housings of electromechanical equipment and instrumentation such as cameras.

The method can also be applied to create entire photomasks and circuit patterns in a manufacturing environment. FIG. 7 illustrates a rapid technique suitable for volume production of circuit patterns. A high energy radiation beam 82, such as may be produced by an eximer laser, is passed through a photomask 84 having a pattern which is highly reflective to the radiation. The structural portion of the photo mask is highly transmissive to the radiation. A multilayered structure layer 86 (of the type illustrated in FIG. 2) comprising patterning material 26 and matrix material 28, is placed between the photomask and a deposition surface 92 of a receiving substrate 94. The radiation beam may be focused to reduce the resulting image which is cast from the photomask upon the surface 92. The entire image may be mapped onto the surface 92 without requiring serial deposition of the patterning material. In addition to providing direct metallization of the circuit structure, materials used in other steps of circuit fabrication processes, e.g., mask levels, device isolation layers, or materials which are deposited for in situ reaction, may be applied with this method.

Other applications of the method and system for forming a pattern on a deposition surface will be apparent to those skilled in the various arts of pattern making. It is also clear that the invention may be modified in numerous ways to optimize features such as the thickness and width of patterned layers. Various types of radiation beams can also be used to heat the matrix material. These include particle beams and very short wavelength electromagnetic radiation.

Although the preferred form of the method involves vaporizing and condensing the patterning material, the invention is of a more general nature and includes the process of melting the patterning material from a solid layer and then depositing the melted material upon a deposition surface where it may solidify to form a desired pattern.

The method presented herein can be applied to form patterns of varying linewidth and thickness, including metal and dielectric patterns of the scale used in the manufacture of integrated circuitry.

I claim:

1. A method for forming a pattern of material on a deposition surface comprising the steps of:
   placing a layer, comprising a substrate having first and second sides and a sublayer of patterning material, next to the surface with the sublayer of patterning material positioned between the second side of the substrate and the deposition surface;
   introducing radiant or thermal energy to the layer from the first side of the substrate; and
   vaporizing a portion of the sublayer to deposit patterning material on the surface, said vaporization effected by thermally conducting said energy through the substrate.

2. The method of claim 1 wherein the step of heating the layer is performed by transferring energy from a radiation source to the layer.

3. The method of claim 2 wherein the step of heating the layer is performed by directing a particle beam on a portion of the layer.

4. The method of claim 3 wherein the particle beam comprises electrons.

5. The method of claim 2 wherein the step of heating the layer is performed by directing coherent radiation on a portion of the layer.

6. The method of claim 5 wherein the coherent radiation is focused.

7. The method of claim 1 wherein the patterning material has a relatively low vaporization temperature and the substrate has a relatively high vaporization temperature.

8. The method of claim 2 wherein the radiation is provided by a laser.

9. The method of claim 7 wherein the vaporization temperature of the patterning material is lower than the melting temperature of the substrate.

10. The method of claim 1 wherein the substrate provides structural integrity to the layer after patterning material is deposited.

11. The method of claim 1 wherein the substrate mitigates transmission of direct radiation through the layer as patterning material is deposited.

12. The method of claim 1 wherein deposition is accomplished by condensing patterning material upon the deposition surface.

13. The method of claim 1 wherein the patterning material is conductive.

14. The method of claim 1 wherein the step of placing the layer next to the deposition surface results in physical contact between the layer and the deposition surface.

15. The method of claim 1 wherein the deposition surface includes a surface defining a hole formed in a circuit structure and the patterning material is deposited along the surface defining the hole.

16. The method of claim 1 wherein the deposition surface is formed along a multilayered structure and patterning material is deposited to form an ohmic connection between different layers of said structure.

17. The method of claim 16 wherein the ohmic connection is made by:
   forming a hole through at least one layer of said structure; and
   depositing patterning material in the hole and between said different layers.

18. The method of claim 1 wherein the surface is nonplanar.

19. The method of claim 1 wherein the surface is curved.

20. The method of claim 18 wherein the surface comprises granular silicon.

21. The method of claim 18 wherein the surface comprises particles having diameters greater than 0.005 centimeters.

22. The method of claim 18 wherein the surface comprises particles having diameters greater than 0.01 centimeters.

23. A method for forming a pattern of material on a deposition surface comprising the steps of:
   placing a foil comprising patterning material and a matrix material next to the surface wherein the patterning material has a relatively low temperature of vaporization and the matrix material has a relatively high temperature of vaporization, said foil having a first side facing the deposition surface and a second side facing away from the deposition surface;

introducing radiant or thermal energy from an external source to the second side of the foil;

thermally conducting said energy from the second side of the foil to the first side of the foil;

vaporizing the patterning material with said thermally conducted energy; and depositing a portion of the patterning material on the surface.

24. The method of claim 23 wherein the vaporization temperature of the patterning material is lower than the melting temperature of the substrate.

25. The method of claim 23 wherein the step of heating the foil is performed by transferring energy from a radiation source to the layer.

26. The method of claim 25 wherein the step of heating the layer is performed by directing a particle beam on a portion of the layer.

27. The method of claim 26 wherein the particle beam comprises electrons.

28. The method of claim 23 wherein the step of heating the layer is performed by directing coherent radiation on a portion of the layer.

29. The method of claim 28 wherein the coherent radiation is focused.

30. The method of claim 28 wherein the radiation is provided by a laser.

31. A method for forming a pattern of material on a first layer having a deposition surface with a radiation source comprising the steps of:

placing a second layer comprising patterning material next to the surface;

transmitting radiant energy from the source and through the first layer to the second layer to provide sufficient thermal energy with the transmitted radiant energy to vaporize some of the patterning material; and depositing a portion of the vaporized patterning material on the deposition surface.

32. The method of claim 31 wherein vaporized patterning material is deposited on the deposition surface by condensation.

33. The method of claim 31 wherein:

the patterning material is formed in combination with a matrix material;

the patterning material has a relatively low temperature of vaporization; and the matrix material has a relatively high temperature of vaporization.

34. The method of claim 31 wherein the second layer is formed as a multi-layered structure comprising a substrate containing matrix material which is relatively non-transmissive to the radiant energy and a sublayer comprising patterning material which is relatively transmissive to the radiant energy; and wherein the step of vaporizing some of the patterning material is effected by:

transmitting the radiation first through the deposition surface and then through the sublayer to the substrate to provide thermal energy to the substrate; and conducting the thermal energy from the substrate to the sublayer to vaporize patterning material.

35. The method of claim 34 wherein the substrate predominantly comprises the matrix material and the sublayer predominantly comprises the patterning material.

36. The method of claim 31 wherein the radiant energy is coherent.

37. The method of claim 31 wherein the radiant energy is focused.

38. The method of claim 34 wherein the radiant energy is focused onto the matrix material.

39. A method of forming a pattern on a surface of a first layer having first and second sides facing away from one another comprising the steps of:

placing a second layer comprising patterning material along the first side of the first layer, said second layer having a vaporization surface facing the first layer;

transmitting radiation through the second side of the first layer, then through the first side of the first layer and to the second layer to impart thermal energy to the second layer, said energy sufficient to vaporize some of the patterning material from the vaporization surface; and condensing some of the vaporized patterning material on to the first side of the first layer.

40. The method of claim 39 wherein:

the second layer is formed as a multi-layered structure comprising a substrate containing material which is relatively non-transmissive to the radiant energy, and a sublayer comprising patterning material which is relatively transmissive to the radiant energy; and the step of vaporizing patterning material is effected by conducting thermal energy from the substrate to the patterning material.

41. The method of claim 2 wherein the step of transferring energy is effected by passing a radiation beam along the layer.

42. The method of claim 25 wherein energy is transferred by passing a radiation beam along the foil.

43. The method of claim 31 wherein the radiant energy is formed as a beam which is passed along the second layer.

44. The method of claim 39 wherein the radiation is formed as a collimated or focused beam which is passed along the second layer.

* * * * *